United States Patent
Ha et al.

(10) Patent No.: US 8,902,628 B2
(45) Date of Patent: Dec. 2, 2014

(54) RESISTIVE MEMORY DEVICE AND SENSING MARGIN TRIMMING METHOD THEREOF

(75) Inventors: Daewon Ha, Seoul (KR); Jung Hyuk Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 302 days.

(21) Appl. No.: 13/485,163

(22) Filed: May 31, 2012

(65) Prior Publication Data

US 2012/0314478 A1    Dec. 13, 2012

(30) Foreign Application Priority Data

Jun. 9, 2011    (KR) .................. 10-2011-0055722

(51) Int. Cl.
*G11C 11/00*    (2006.01)
*G11C 8/10*    (2006.01)
*G11C 13/00*    (2006.01)

(52) U.S. Cl.
CPC .......... *G11C 8/10* (2013.01); *G11C 2013/0054* (2013.01); *G11C 13/0004* (2013.01); *G11C 13/0007* (2013.01); *G11C 13/004* (2013.01); *G11C 13/0069* (2013.01); *G11C 2213/75* (2013.01); *G11C 13/0038* (2013.01); *G11C 13/003* (2013.01)
USPC ................. 365/148; 365/189.011; 365/225.7; 365/189.07; 365/185.2

(58) Field of Classification Search
CPC ..... G11C 16/10; G11C 16/28; G11C 11/5628
USPC ........ 365/148, 189.011, 225.7, 189.07, 185.2
See application file for complete search history.

(56) References Cited

U.S. PATENT DOCUMENTS

| | | | |
|---|---|---|---|
| 7,289,371 B2 * | 10/2007 | Ohta | 365/189.16 |
| 7,495,947 B2 * | 2/2009 | Scheuerlein et al. | 365/148 |
| 7,656,710 B1 * | 2/2010 | Wong | 365/185.19 |
| 8,116,117 B2 * | 2/2012 | Cho et al. | 365/148 |
| 8,243,542 B2 * | 8/2012 | Bae et al. | 365/203 |
| 8,618,786 B1 * | 12/2013 | Perisetty et al. | 323/313 |
| 2001/0000023 A1 * | 3/2001 | Kawahara et al. | 365/185.24 |
| 2005/0254302 A1 * | 11/2005 | Noguchi | 365/185.17 |
| 2006/0239071 A1 * | 10/2006 | Ohta | 365/185.02 |
| 2008/0025078 A1 * | 1/2008 | Scheuerlein et al. | 365/163 |
| 2009/0109738 A1 | 4/2009 | Donze et al. | |
| 2009/0122598 A1 | 5/2009 | Toda et al. | |
| 2009/0237979 A1 | 9/2009 | Mukai et al. | |

(Continued)

FOREIGN PATENT DOCUMENTS

| | | |
|---|---|---|
| JP | 2009-117006 | 5/2009 |
| JP | 2009-289352 | 12/2009 |

(Continued)

*Primary Examiner* — Tuan T Nguyen
(74) *Attorney, Agent, or Firm* — F. Chau & Associates, LLC

(57) ABSTRACT

A resistive memory device and a sensing margin trimming method are provided. The resistive memory device includes a memory cell array and a trimming circuit. The memory cell array has a plurality of resistive memory cells. The trimming circuit generates a trimming signal according to a characteristic distribution shift value of the resistive memory cells. With the inventive concept, although a characteristic distribution of memory cells is varied, an erroneous read operation is minimized or reduced by securing a sensing margin stably. Accordingly, a fabrication yield of the resistive memory device is bettered.

20 Claims, 15 Drawing Sheets

(56) References Cited

U.S. PATENT DOCUMENTS

| | | |
|---|---|---|
| 2009/0296452 A1 | 12/2009 | Tonomura |
| 2010/0118595 A1* | 5/2010 | Bae et al. ............... 365/148 |
| 2011/0080775 A1* | 4/2011 | Bae et al. ............... 365/163 |

FOREIGN PATENT DOCUMENTS

| | | |
|---|---|---|
| KR | 1020050118331 | 12/2005 |
| KR | 1020090127643 | 12/2009 |
| KR | 1020100098969 | 9/2010 |

* cited by examiner

RESISTIVE MEMORY DEVICE AND SENSING MARGIN TRIMMING METHOD THEREOF

CROSS-REFERENCE TO RELATED APPLICATIONS

This application claims priority to Korean Patent Application No. 10-2011-0055722 filed Jun. 9, 2011 pursuant to 35 U.S.C. §119, the entirety of which is incorporated by reference herein.

TECHNICAL FIELD

Exemplary embodiments relate to a semiconductor memory device, and more particularly, relate to a resistive memory device and a sensing margin trimming method of the resistive memory device.

DISCUSSION OF THE RELATED ART

Demand for high-density and low-power semiconductor devices led to ongoing research on nonvolatile and refresh-free next-generation resistive memory devices, such as phase change random access memories (PRAMs), resistive RAMs (RRAMs), or magnetic RAMs (MRAM). Such resistive memory devices exhibit a resistance value that varies according to current or voltage.

A resistive memory device includes a memory cell array having multiple memory cells. Each memory cell includes a variable resistance element and a switching element. The variable resistance element may be connected between a bit line and the switching element, and the switching element may be connected between the variable resistance element and a word line.

The resistive memory devices may be classified into the above-exemplified PRAMs, MRAMs, or RRAMs according to the type of variable resistance element. For example, the PRAMs include as the variable resistance element a phase change substance (e.g., GST (Ge—Sb—Te)) whose resistance varies according to temperature, and the RRAMs include as the variable resistance element a transition metal oxide between upper and lower electrodes. The MRAMs include as the variable resistance element a dielectric material between upper and lower electrodes formed of a magnetic substance.

SUMMARY

Embodiments of the inventive concept provide a resistive memory device that can perform a stable read operation and can secure a sufficient sensing margin together with a better fabrication yield and a sensing margin trimming method of the resistive memory device.

An embodiment of the inventive concept provides a resistive memory device which includes a memory cell array having a plurality of resistive memory cells and a trimming circuit configured to generate a trimming signal according to a characteristic distribution shift value of the resistive memory cells.

According to an embodiment, the characteristic distribution shift value is obtained based on a shift of a peak distribution value of a reset current for the resistive memory cells.

According to an embodiment, the trimming signal is applied to a read circuit of the resistive memory device.

According to an embodiment, the trimming signal is applied as a sensing reference value of a sense amplifier in the read circuit.

According to an embodiment, the trimming signal is applied as a bias value of a biasing part in the read circuit.

According to an embodiment, the trimming signal is applied to a write circuit of the resistive memory device to compensate for a write operation.

According to an embodiment, at least one fuse connected with the write circuit is disconnected according to the trimming signal.

According to an embodiment, the resistive memory device includes a PRAM or an MRAM.

According to an embodiment, the characteristic distribution shift value is determined according to resistance values at set and reset tails of a resistance distribution of the resistive memory cells.

According to an embodiment, the trimming signal is determined to correspond to an intermediate value between the resistance values at the set and reset tails.

According to an embodiment, the characteristic distribution shift value is determined according to resistance values at set and reset peaks of a resistance distribution of the resistive memory cells.

According to an embodiment, the trimming signal is determined to correspond to an intermediate value between the resistance values of the set and reset peaks.

An embodiment of the inventive concept provides a read method of a resistive memory device which includes a plurality of resistive memory cells. The read method includes generating a trimming signal corresponding to a characteristic distribution shift value of the resistive memory cells, generating a read reference level according to the trimming signal, and determining a data level of a sensing node according to the read reference level.

According to an embodiment, the characteristic distribution shift value is obtained based on a shift of a peak distribution value of a reset current for the resistive memory cells.

According to an embodiment, the characteristic distribution shift value is determined according to resistance values at a set tail of a resistance distribution of set memory cells of the resistive memory cells and resistance values at a reset tail of a resistance distribution of reset memory cells of the resistive memory cells.

BRIEF DESCRIPTION OF THE FIGURES

The embodiments will become apparent from the following description with reference to the accompanying drawings, wherein.

DETAILED DESCRIPTION

Figure 1:
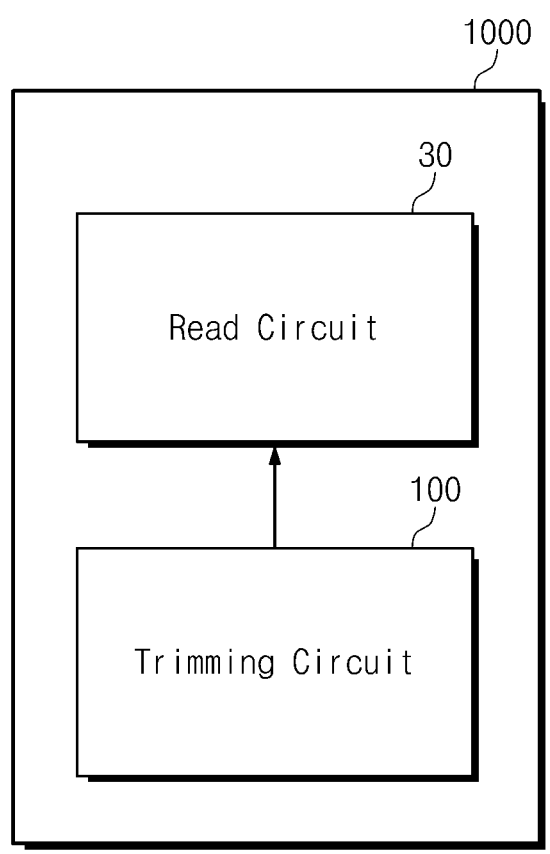
FIG. 1 is a block diagram illustrating a resistive memory device according to an exemplary embodiment of the inventive concept.

Embodiments of the inventive concept are described more fully hereinafter with reference to the accompanying drawings. The embodiments of the inventive concept may, however, be embodied in many different forms and should not be construed as limited to the embodiments set forth herein. In the drawings, the size and relative sizes of layers and regions may be exaggerated for clarity. The same numbers may refer to the same or substantially the same elements throughout the specification and the drawings.

As used herein, the singular forms "a", "an" and "the" are intended to include the plural forms as well, unless the context clearly indicates otherwise. It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram illustrating a resistive memory device according to an exemplary embodiment of the inventive concept.

Referring to FIG. 1, a resistive memory device 1000 includes a read circuit 30 and a trimming circuit 100. The read circuit 30 is configured to compensate for a read operation according to a trimming signal provided from the trimming circuit 100.

The resistive memory device 1000 is described in greater detail with reference to FIG. 2.

Figure 2:
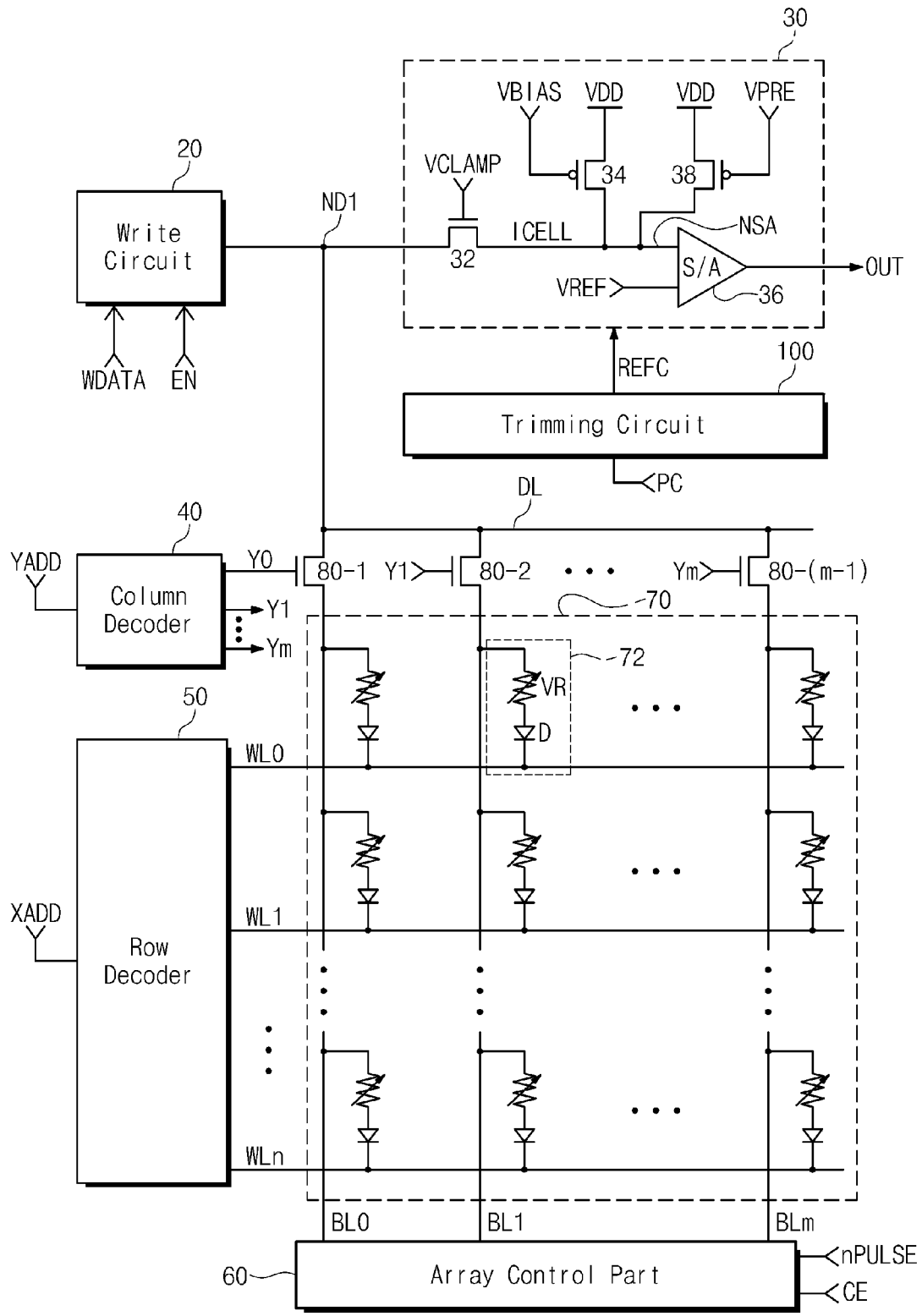
FIG. 2 is a circuit diagram illustrating a resistive memory device as illustrated in FIG. 1.

FIG. 2 is a circuit diagram illustrating a resistive memory device as illustrated in FIG. 1.

Referring to FIG. 2, a resistive memory device 1000 includes a write circuit 20, a read circuit 30, a column decoder 40, a row decoder 50, an array control part 60, a memory cell array 70, and a trimming circuit 100.

In FIG. 2, when a memory cell 72 of the memory cell array 70 is a phase change memory cell that includes a variable resistance element VR formed of a phase change substance (e.g., GST) and an access diode D, the resistive memory device 1000 is a PRAM.

For ease of description, increasing a sensing margin to minimize or reduce an erroneous read operation using the PRAM is described. However, the embodiments of the inventive concept may be also applied to RRAM, or MRAM.

The diode D of the phase change memory cell 72 has a cathode connected with a word line WL that extends along a row of the memory cell array 70. One end of the variable resistance element VR is coupled with a bit line BL that extends along a column of the memory cell array 70.

A phase change characteristic of the phase change memory cell 72 and a write operation of the phase change memory cell 72 are described in greater detail with reference to FIGS. 3 and 4.

Figure 3:
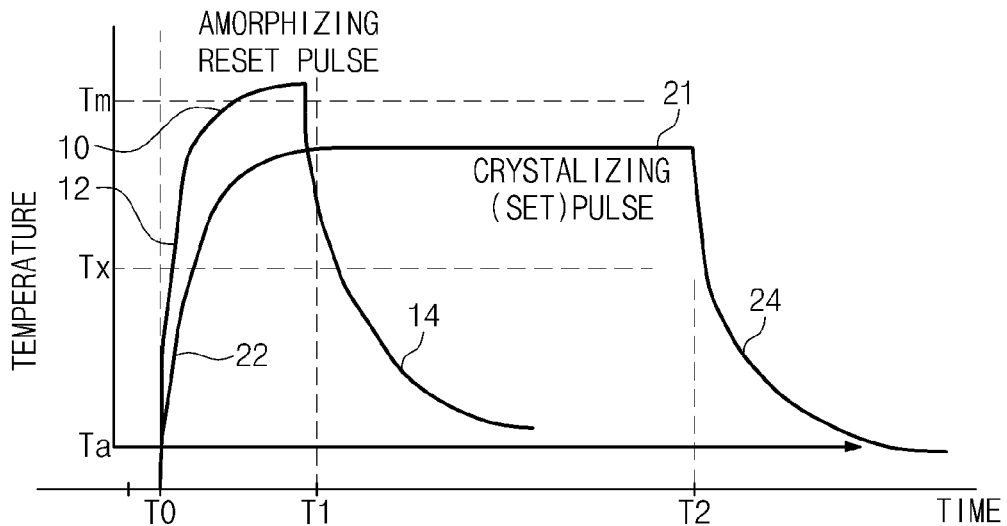
FIG. 3 is a diagram illustrating a phase change characteristic of a memory cell as illustrated in FIG. 1.
Figure 4:
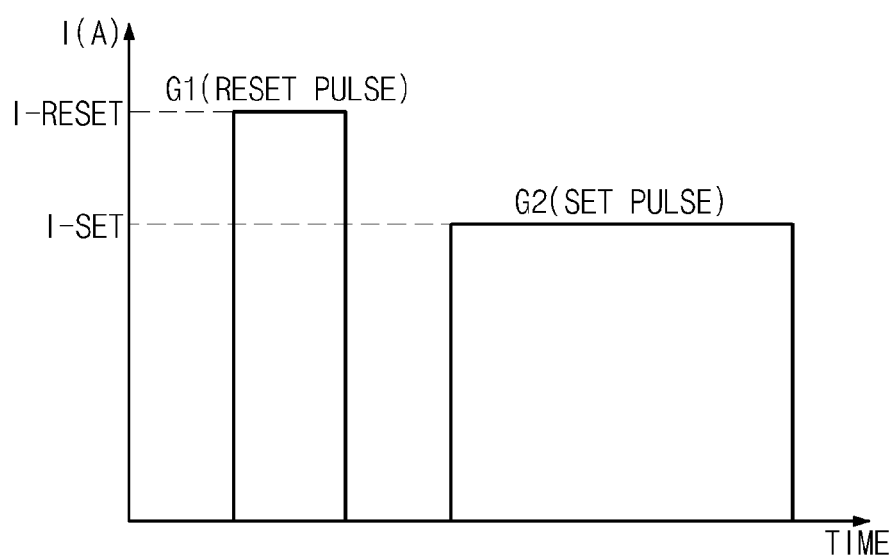
FIG. 4 is a diagram illustrating waveforms of current pulses applied when data is written in a memory cell as illustrated in FIG. 1.

FIG. 3 is a diagram illustrating a phase change characteristic of a memory cell as illustrated in FIG. 1, and FIG. 4 is a diagram illustrating waveforms of current pulses applied when data is written in a memory cell as illustrated in FIG. 1.

FIG. 3 shows characteristics of a phase change substance (e.g., GST) according to time and temperature. As shown in FIG. 3, the horizontal axis indicates time, and the vertical time indicates temperature T. An amorphous state of the phase change material GST is accomplished by heating the phase change substance GST over a melting temperature Tm and quickly cooling the phase change substance GST as indicated by reference numerals 12, 10, and 14. A crystalline state of the phase change substance GST is accomplished by heating the phase change substance GST over a crystallization temperature Tx during a predetermined time and cooling the phase change substance GST as indicated by reference numerals 22, 21, and 24.

FIG. 4 shows waveforms of current pulses for turning the phase change memory cell 72 of FIG. 2 into the first and second resistance states are shown. Referring to FIG. 4, the horizontal axis indicates time, and the vertical axis indicates current I. A level of a reset current pulse G1 is higher than a level of a set current pulse G2. A time of applying the set current pulse G2 is longer than a time of applying the reset current pulse G1. The reset and set current pulses G1 and G2 refer to a write current that is applied to a phase change memory cell to store a binary value of '0' or '1' in the phase change memory cell.

A change of a state of the phase change substance GST from the amorphous state to the crystalline state is referred to 'SET, and a change of a state of the phase change substance GST from the crystalline state to the amorphous state is referred to 'RESET'. When the phase change substance GST is in the amorphous state, the phase change substance GST has a large resistance value compared with when the phase change substance GST is in the crystalline state. In other words, a resistance value of a reset memory cell is larger than a resistance value of a set memory cell.

A state of the phase change substance GST may be varied by a laser beam or a current. A method of using a current to change the state of the substance GST may facilitate realization of a memory chip. The method using a current selectively generates current pulses as illustrated in FIG. 4 by the write circuit 20 in FIG. 2 and provides the current pulses to a bit line via a selected one of column gates 80-1 to 80-(m−1) for data routing. Thus, the phase change substance GST becomes a set or reset state by the Joule's heat which is generated according to current magnitude and current applying time.

Figure 5:
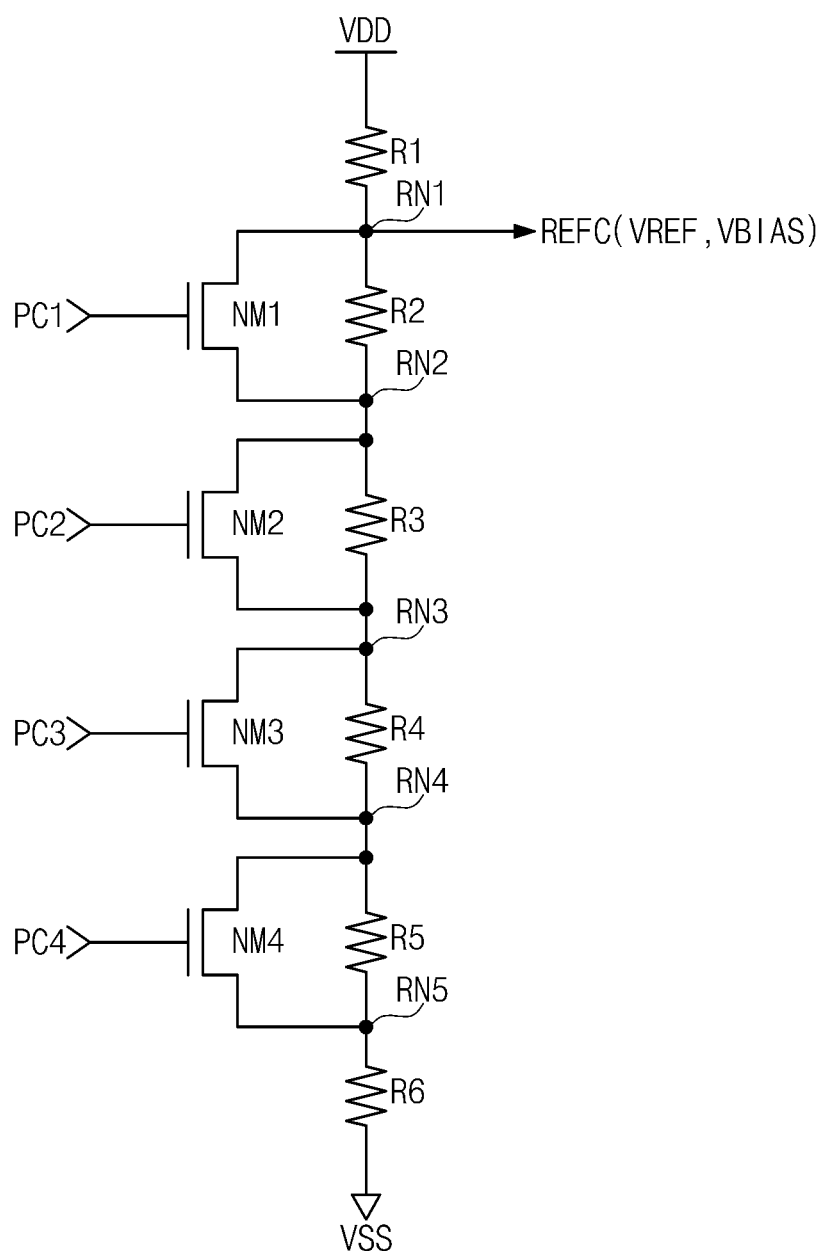
FIG. 5 is a circuit diagram illustrating a trimming circuit as illustrated in FIG. 1 according to an exemplary embodiment of the inventive concept.
Figure 6:
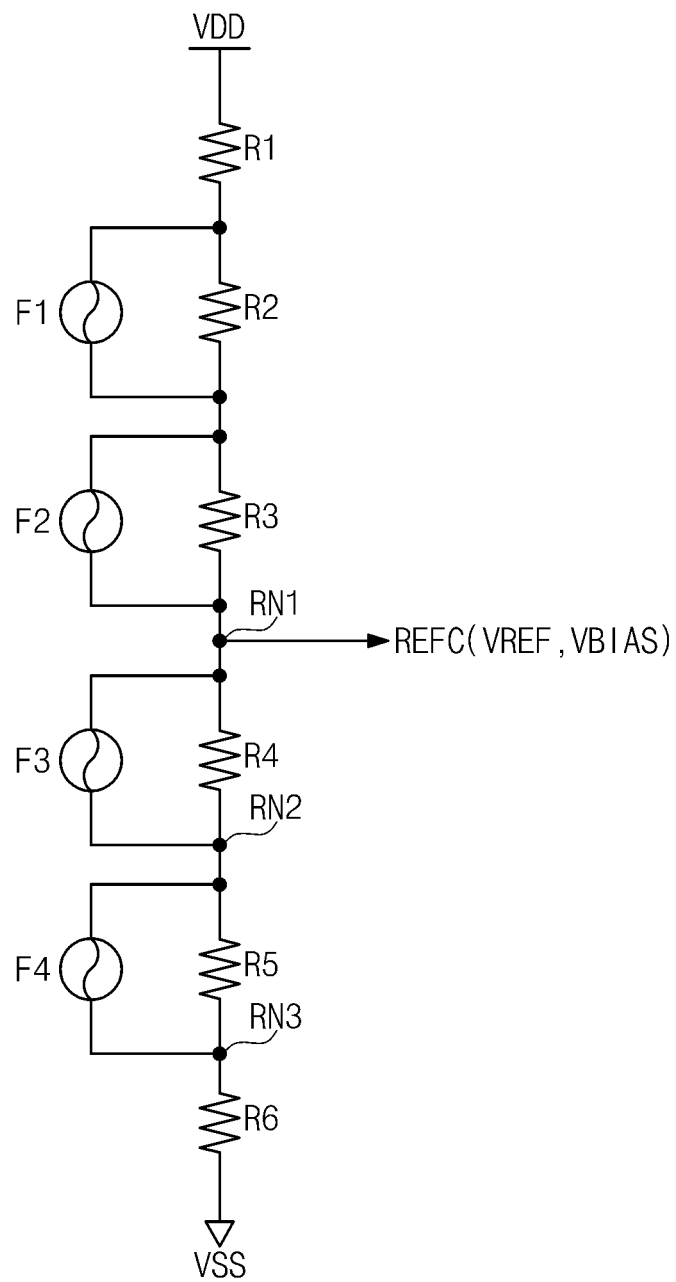
FIG. 6 is a circuit diagram illustrating a trimming circuit as illustrated in FIG. 1 according to an exemplary embodiment of the inventive concept.

FIG. 5 is a circuit diagram illustrating a trimming circuit as illustrated in FIG. 1 according to an exemplary embodiment of the inventive concept. FIG. 6 is a circuit diagram illustrating a trimming circuit as illustrated in FIG. 1 according to an exemplary embodiment of the inventive concept.

Referring to FIG. 5, a trimming circuit 101 includes a plurality of resistors R1 to R6 connected in series between a power supply voltage VDD and a ground VSS and first to fourth NMOS transistors NM1 to NM4. The first to fourth NMOS transistors NM1 to NM4 are driven by compensation control signals PC1 to PC4, respectively, and output a compensation reference voltage REFC to a compensation reference node RN1 as a trimming signal.

When the compensation control signals PC1 to PC4 (hereinafter, referred to as a code stream of compensation control signals) are '1100', the first and second NMOS transistors NM1 and NM2 are turned on, and thus the resistors R2 and R3 don't affect determining a level of the compensation reference voltage REFC. A level of the compensation reference voltage REFC is determined to have an appropriate value considering a positive shift or a negative shift.

When a characteristic distribution shift value is a positive shift value, a level of the compensation reference voltage REFC may need to increase. For example, the code stream of the compensation control signals PC1 to PC4 has a value of '1000', and the first NMOS transistor NM1 is turned on, and thus the resistor R2 does not take part in determining a level of the compensation reference voltage REFC. Thus, since a level of the compensation reference voltage REFC is determined by the resistors R1 and R3 to R6, a level of the compensation reference voltage REFC increases.

When a characteristic distribution shift value is a negative shift value, a level of the compensation reference voltage REFC may need to decrease. For example, the code stream of the compensation control signals PC1 to PC4 has a value of '1101', and the first, second, and fourth NMOS transistors NM1, NM2, and NM4 are turned on, and thus the resistors R2, R3, and R5 don't participate in determining a level of the compensation reference voltage REFC. Thus, since a level of the compensation reference voltage REFC is determined by the resistors R1, R4, and R6, a level of the compensation reference voltage REFC decreases.

The characteristic distribution shift value is determined by measuring a shift of a peak value of a reset current distribution for resistive memory cells or according to a resistance value at a set tail of a measured resistance distribution of set memory cells and a resistance value at a reset tail of a measured resistance distribution of reset memory cells. According to an embodiment, the characteristic distribution shift value depends upon a resistance value at a set peak of a measured resistance distribution of set memory cells and a resistance value at a reset peak of a measured resistance distribution of reset memory cells.

The compensation reference voltage REFC generated as the trimming signal is applied to the read circuit 30 and compensates for a read operation. The trimming signal is used as a sensing reference value VREF of a sense amplifier 36 in the read circuit 30 or as a bias value VBIAS of a biasing part 34 in the read circuit 30.

FIG. 6 shows an example of a trimming circuit including fuses that may be blown by a laser beam or current when a level of the trimming signal is set permanently.

Referring to FIG. 6, a trimming circuit 102 includes a plurality of resistors R1 to R6 connected in series between the power supply voltage VDD and the ground VSS and first to fourth fuses F1 to F4. The first to fourth fuses F1 to F4 are selectively disconnected and output a compensation reference voltage REFC to a compensation reference node RN1 as a trimming signal.

A level of the compensation reference voltage REFC is set to an appropriate value considering a positive shift or a negative shift when the first to fourth fuses F1 to F4 remain uncut.

When a characteristic distribution shift value is a positive shift, at least one of the third and fourth fuses F3 and F4 is disconnected. A level of the compensation reference voltage REFC is determined according to the resistor R6 together with the resistor R4 or R5. Thus, a resistance value between the output node RN1 and the ground VSS increases, and a level of the compensation reference voltage REFC increases.

When a characteristic distribution shift value is a negative shift, at least one of the first and second fuses F1 and F2 is disconnected. A level of the compensation reference voltage REFC is determined according to the resistor R1 together with the resistor R2 or R3. Thus, a resistance value between the power supply voltage VDD and the output node RN1 increases, and a level of the compensation reference voltage REFC decreases.

The compensation reference voltage REFC generated as the trimming signal is applied to the read circuit 30 and compensates for a read operation. The trimming signal is used as a sensing reference value VREF of the sense amplifier 36 in the read circuit 30 or as a bias value VBIAS of the biasing part 34 in the read circuit 30.

Figure 7:
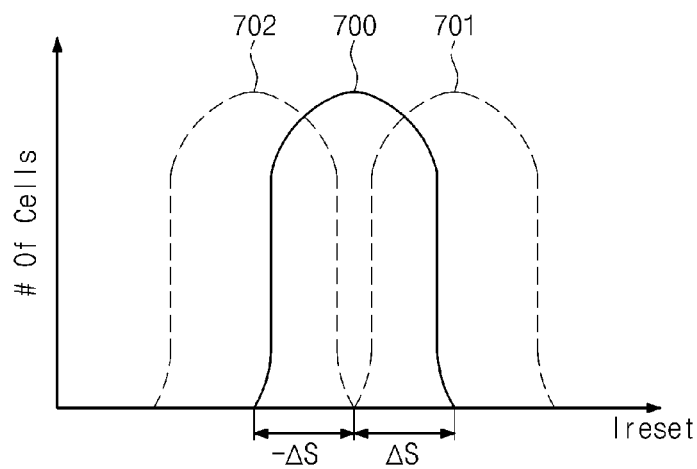
FIG. 7 is a diagram illustrating a characteristic distribution shift of a peak value of a reset current according to an exemplary embodiment of the inventive concept.

FIG. 7 is a diagram illustrating a characteristic distribution shift of a peak value of a reset current according to an exemplary embodiment of the inventive concept.

FIG. 7 illustrates an example where the phase change memory cells have three reset current distributions when the phase change memory cells are in a reset state. As shown in FIG. 7, the horizontal axis indicates reset current Ireset, and the vertical axis indicates the number of cells.

All the memory cells in a memory cell array need not be measured to obtain a peak distribution of a reset current. For example, a reset current is measured using selected/sampled memory cells.

For example, for purposes of illustration, a designed peak characteristic distribution of a reset current corresponds to a graph 700, and a measured peak characteristic distribution of a reset current corresponds to a graph 701. The measured peak characteristic distribution has been shifted by ΔS. In other words, the measured peak characteristic distribution has been positively shifted. Thus, a trimming signal may be adjusted according to the positive shift.

For example, for purposes of illustration, the designed peak characteristic distribution corresponds to the graph 700, and the measured peak characteristic distribution corresponds to a graph 702. The measured peak characteristic distribution has been negatively shifted by −ΔS. Thus, a trimming signal may be adjusted according to the negative shift. In the case of a PRAM memory cell, a set resistance value decreases as the reset current beset increases.

Figure 8:
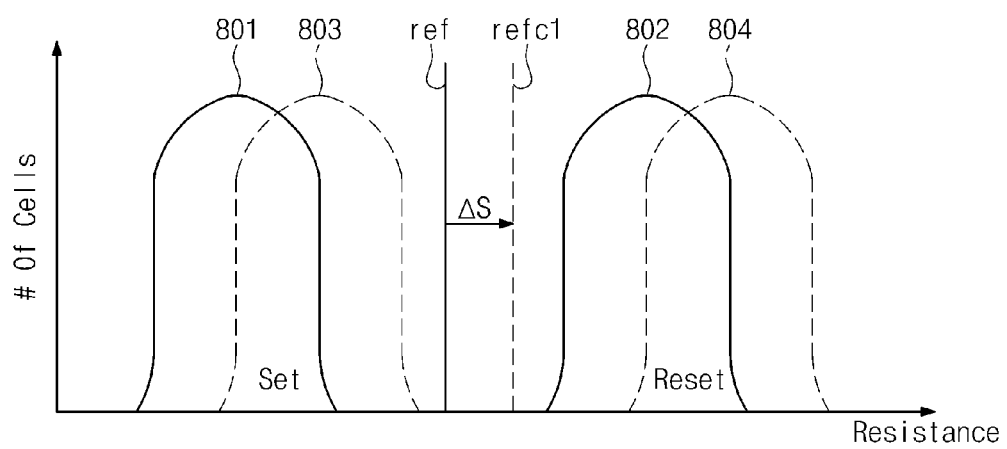
FIGS. 8 and 9 are diagrams illustrating characteristic distribution shifts of resistance values at set and reset tails according to an exemplary embodiment of the inventive concept.
Figure 9:
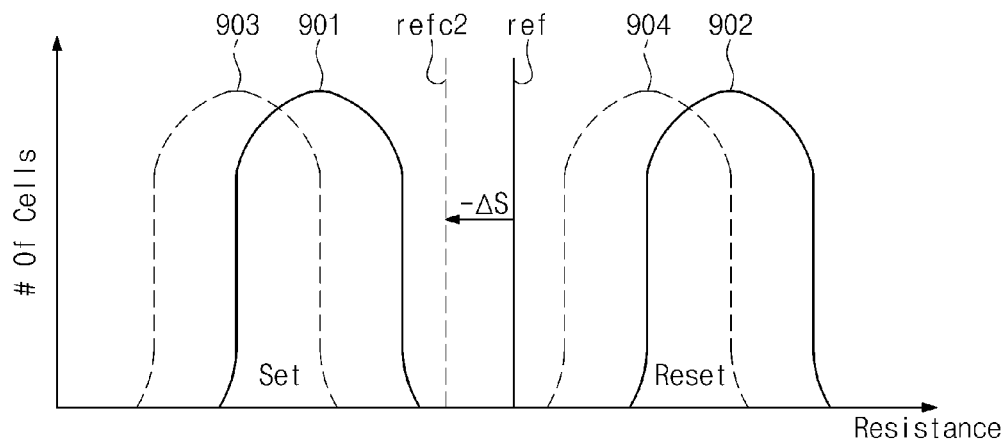

FIGS. 8 and 9 are diagrams illustrating shifts of characteristic distributions of resistance values at set and reset tails according to an exemplary embodiment of the inventive concept.

As shown in FIGS. 8 and 9, the horizontal axis indicates resistance value, and the vertical axis indicates the number of cells.

A graph 801 indicates a designed resistance distribution of phase change memory cells when the phase change memory cells are in a set state, and a graph 802 indicates a designed resistance distribution of phase change memory cells when the phase change memory cells are in a reset state.

A resistance distribution is shifted when threshold voltages of transistors are varied due to a process variation or when a thickness of a lower electrode of a memory cell is varied due to a process variation. For example, a graph 803 is formed when the graph 801 is shifted by ΔS, and a graph 804 is formed when the graph 802 is shifted by ΔS. For example, the measured characteristic distribution is positively shifted. According to an embodiment, since a trimming signal is determined to indicate an intermediate value between actually measured resistance values at set and reset tails, a reference value ref is changed into a positive compensation reference value refc1. Thus, a sufficient sensing margin may be secured. The set tail includes the right tail of the graph 801 or 803, and the reset tail includes the left tail of the graph 802 or 804. As the resistance distribution is positively shifted, a reference value is also positively shifted, and a sensing margin is secured for a read operation.

As illustrated in FIG. 9, a graph 903 is formed when a graph 901 is shifted by −ΔS, and a graph 904 is formed when a graph 902 is shifted by −ΔS. For example, the measured characteristic distribution is negatively shifted. According to an embodiment, since a trimming signal is determined to correspond to an intermediate value between actually measured resistance values at set and reset tails, a reference value ref is changed into a negative compensation reference value refc2. The set tail includes the right tail of the graph 901 or 903, and the reset tail includes the left tail of the graph 902 or 904. As the resistance distribution is negatively shifted, a reference value is also negatively shifted, and a sensing margin is secured for a read operation.

The trimming may prevent a sensing margin from being reduced when a variation occurs between wafers or within a wafer. In the case that a characteristic distribution value is shifted due to a process variation, a reference may be also shifted, thus preventing or minimizing read error.

Figure 10:
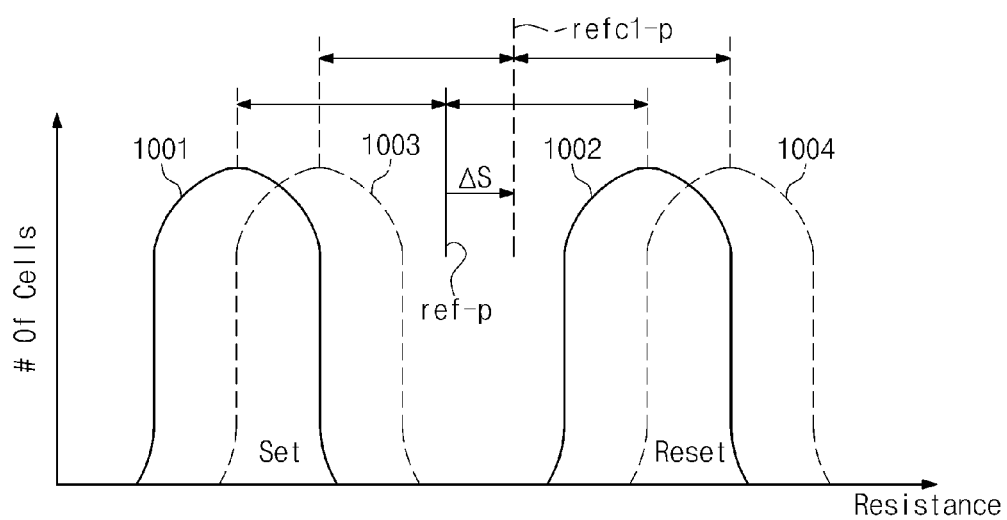
FIGS. 10 and 11 are diagrams illustrating characteristic distribution shifts of resistance values at set and reset peaks according to an exemplary embodiment of the inventive concept.
Figure 11:
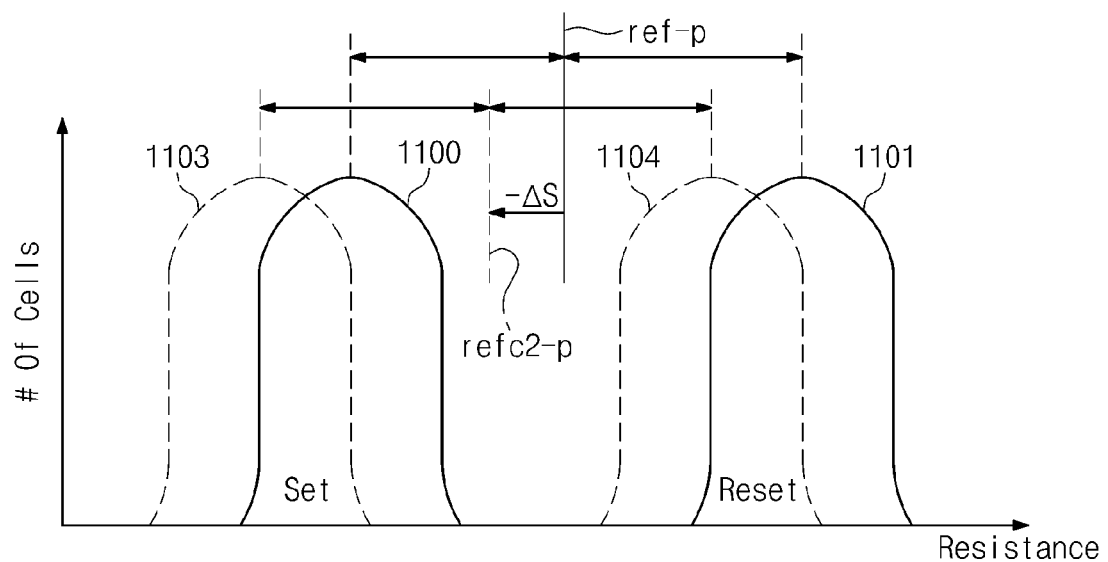

FIGS. 10 and 11 are diagrams illustrating shifts of characteristic distributions of resistance values at set and reset peaks according to an exemplary embodiment of the inventive concept.

As shown in FIGS. 10 and 11, the horizontal axis indicates resistance value, and the vertical axis indicates the number of cells.

A graph 1001 indicates a designed resistance distribution of phase change memory cells when the phase change memory cells are in a set state, and a graph 1002 indicates a designed resistance distribution of phase change memory cells when the phase change memory cells are in a reset state.

A resistance distribution is shifted when threshold voltages of transistors are varied due to a process variation or when a thickness of a lower electrode of a memory cell is varied due to a process variation. For example, a graph 1003 is formed when the graph 1001 is shifted by ΔS, and a graph 1004 is formed when the graph 1002 is shifted by ΔS. For example, the measured characteristic distribution is positively shifted. According to an embodiment, since a trimming signal is determined to correspond to an intermediate value between actually measured resistance values at set and reset peaks, a reference value ref-p is changed into a positive compensation reference value refc1-p. Thus, a sufficient sensing margin may be secured. The set peak includes the distribution peak value of the graph 1001 or 1003, and the reset peak includes the distribution peak value of the graph 1002 or 1004. As the resistance distribution is positively shifted, a reference value is also positively shifted, and thus a sensing margin is secured for a read operation.

As illustrated in FIG. 11, a graph 1103 is formed when a graph 1101 is shifted by −ΔS, and a graph 1104 is formed when a graph 1102 is shifted by −ΔS. For example, the measured characteristic distribution is negatively shifted. According to an embodiment, since a trimming signal is determined to correspond to an intermediate value between actually measured resistance values at set and reset peaks, a reference value ref_p is changed into a negative compensation reference value refc2_p. The set peak includes the distribution peak value of the graph 1101 or 1103, and the reset peak includes the distribution peak value of the graph 1102 or 1104. As the resistance distribution is negatively shifted, a reference value is also negatively shifted, and thus a sensing margin is secured for a read operation.

The trimming may prevent a sensing margin from being reduced when a variation occurs between wafers or within a wafer. In the case that a characteristic distribution value is shifted due to a process variation, a reference may be also shifted, thus preventing or minimizing read error.

Figure 12:
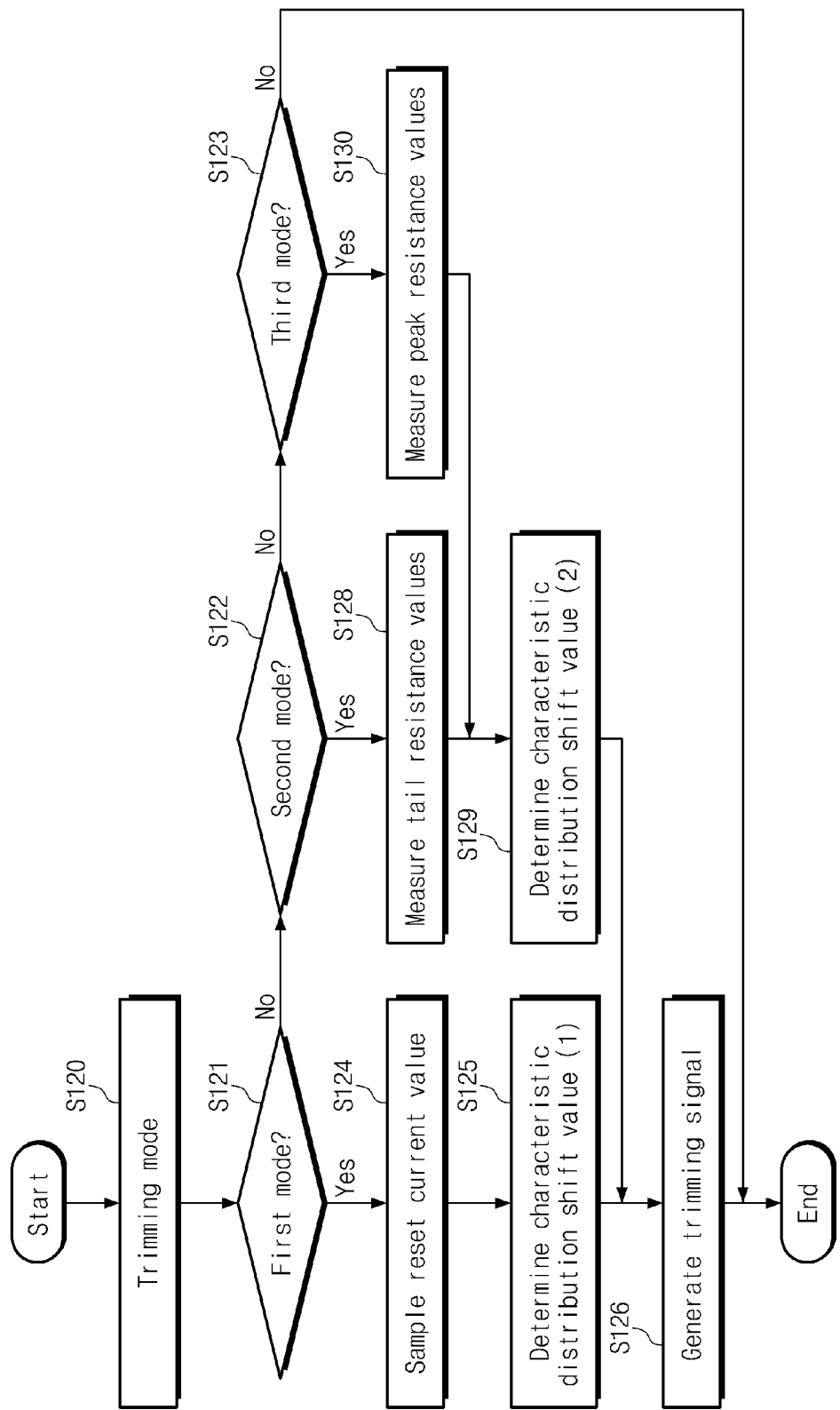
FIG. 12 is a flowchart for describing a trimming signal generating operation according to an exemplary embodiment of the inventive concept.

FIG. 12 is a flowchart for describing a trimming signal generating operation according to an exemplary embodiment of the inventive concept. Referring to FIG. 12, in operation S120, a resistive memory device enters into a trimming mode. One of the first to third modes is selected.

In operation S121, whether the trimming mode is the first mode is judged. For example, according to an embodiment, in the first mode, a trimming signal is generated based on a measured distribution of the reset currents.

In operation S122, whether the trimming mode is the second mode is judged. For example, according to an embodiment, as described with reference to FIGS. 8 and 9, in the second mode, a trimming signal is generated based on measured resistance values at set and reset tails of resistance distributions for resistive memory cells.

In operation S123, whether the trimming mode is the third mode is judged. For example, according to an embodiment, as described with reference to FIGS. 10 and 11, in the third mode, a trimming signal is generated based on measured resistance values at set and reset peaks of resistance distributions for resistive memory cells.

In the first mode, operations S124, S125, and S126 are performed sequentially. In the second mode, operations S128, S129, and S126 are performed sequentially. In the third mode, operations S130, S129, and S126 are performed sequentially.

In operation S124, a reset current value is sampled. In operation S125, a characteristic distribution shift value is determined. According to an embodiment, the characteristic distribution shift value determined in operation S125 corresponds to a distribution shift of measured reset current values.

In operation S126, a trimming signal is generated.

In operation S128, resistance values at set and reset tails are measured from a measured resistance distribution for resistive memory cells.

In operation S130, resistance values at set and reset peaks are measured from a measured resistance distribution for resistive memory cells.

In operation S129, a characteristic distribution shift value is determined. According to an embodiment, the characteristic distribution shift value determined in operation S129 corresponds to a distribution shift of set memory cells and reset memory cells.

Returning to FIG. 2, the trimming signal REFC generated by the trimming circuit 100 is applied as a reference voltage VREF to a sense amplifier 36 in the read circuit 30. For example, a level of the reference voltage VREF of the sense amplifier 36 is adjusted according to a characteristic distribution shift value. For example, in the case that a positive shift arises as illustrated in FIG. 8, a level of the reference voltage VREF is positively shifted. The sense amplifier 36 outputs data '1' or '0' to an output terminal OUT by comparing the trimmed reference voltage VREF with a cell voltage on a sensing node NSA. In the case of a single-bit memory cell, 1-bit data '1' or '0' is output. In the case of a multi-bit (e.g., 2-bit) memory cell, e.g., 2-bit data '00', '01', '10', or '11' is output by two sense amplifiers, and since two different reference voltages are used, a sensing margin becomes tighter. Thus, the trimming circuit 100 may further prevent a read error when including multi-bit memory cells.

A typical write operation of writing data in the memory cell 72 is performed when a word line WL0 is activated by the row decoder 50 receiving a row address XADD, a column gate 80-2 is driven by the column decoder 40 receiving a column address YADD, and a data line DL is applied, via a node ND1, with a reset or set pulse generated by the write circuit 20 receiving write data WDATA and an enable signal EN. The array control part 60 keeps a selected bit line, e.g., BL1, at a power supply voltage or a proper voltage level, and unselected bit lines are grounded or floated.

When reset by the reset current pulse, the phase change memory cell 72 stores data '1'. When set by the reset current pulse, the phase change memory cell 72 stores data '0'.

The read circuit 30 is activated by a read operation. The read circuit 30 read data by applying a current to a selected phase change memory cell 72 and sensing a level variation of the sensing node NSA caused by a current Icell passing through the selected phase change memory cell 72. The read circuit 30 includes a pre-charge part 38, a biasing part 34, a clamping part 32, and a sense amplifier 36.

Before performing a sensing operation, the pre-charge part 38 pre-charges the sensing node NSA to a predetermined level, for example, the power supply voltage VDD, during a pre-charge time. The pre-charge part 38 includes a PMOS transistor which is connected between the power supply voltage VDD and the sensing node NSA and which receives a pre-charge control signal VPRE via a gate, as illustrated in FIG. 2.

The biasing part 34 provides a bias current to the sensing node NSA to prevent e.g., a voltage level of the sensing node NSA from decreasing due to a current Ica passing through the selected phase change memory cell 72. For example, when the phase change memory cell 72 is in a set state, the amount of the current Icell increases since a resistance value of a phase change substance decreases. When the phase change memory cell 72 is in a reset state, the amount of the current Icell decreases since a resistance value of a phase change substance increases. According to an embodiment, the amount of a current provided from the biasing part 34 is determined to be suitable for compensating for the current Icell in the reset state. According to an embodiment, a level of the sensing node NSA is kept constant in the reset state, and decreases in the set state. Since there is a large difference between a level of the sensing node NSA in the reset state and a level of the sensing node NSA in the set state, the set state and the reset state are discerned easily, and thus a sensing margin may increase.

As illustrated in FIG. 2, the biasing part 34 includes a PMOS transistor which is connected between the power supply voltage VDD and the sensing node NSA and receives a biasing control signal VBIAS via a gate.

The clamping part 32 clamps a level of a bit line BL so that the level of the bit line BL is within a range suitable for reading. The clamping part 32 clamps a level of the bit line BL to a predetermined level below a threshold voltage Vth of a phase change substance since a phase of a phase change substance of the selected phase change memory cell 72 is changed when a level of the bit line BL is over the threshold voltage Vth. The clamping part 32 includes an NMOS transistor which is connected between the bit line BL and the sensing node NSA and receives a clamping control signal VCLAMP via a gate as illustrated in FIG. 2.

The sense amplifier 36 compares a level of the sensing node NSA with a reference voltage VREF trimmed according to an exemplary embodiment of the inventive concept and outputs a result of the comparison to the output terminal OUT.

The sense amplifier 36 includes a voltage sense amplifier which compares the reference voltage VREF with a voltage of the sensing node NSA. According to an embodiment, the sense amplifier 36 includes a current sense amplifier which senses a variation of a current flowing through the bit line BL of the selected phase change memory cell 72 with respect to a reference current.

The array control part 60 includes transistors which are turned on according to the enable signal CE to apply the power supply voltage VDD to bit lines of selected memory cells. The array control part 60 further includes transistors which set bit lines to a ground level in response to a pulse signal nPULSE before a read operation or a write (or programming) operation is performed.

A gain of an effective sensing margin increases when a reference is shifted considering a degree of a cell characteristic distribution shift.

Figure 13:
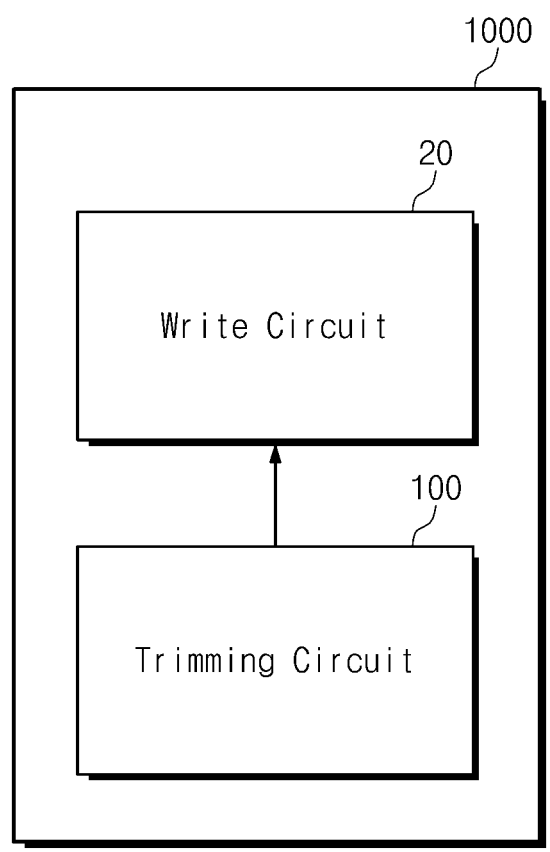
FIG. 13 is a block diagram illustrating a resistive memory device according to an exemplary embodiment of the inventive concept.

FIG. 13 is a block diagram illustrating a resistive memory device according to an exemplary embodiment of the inventive concept.

Referring to FIG. 13, a resistive memory device 1000 includes a write circuit 20 and a trimming circuit 1000. The write circuit 20 compensates for a write operation according to a trimming operation of the trimming circuit 100.

The write circuit 20 and the trimming circuit 100 are described in greater detail with reference to FIG. 14.

Figure 14:
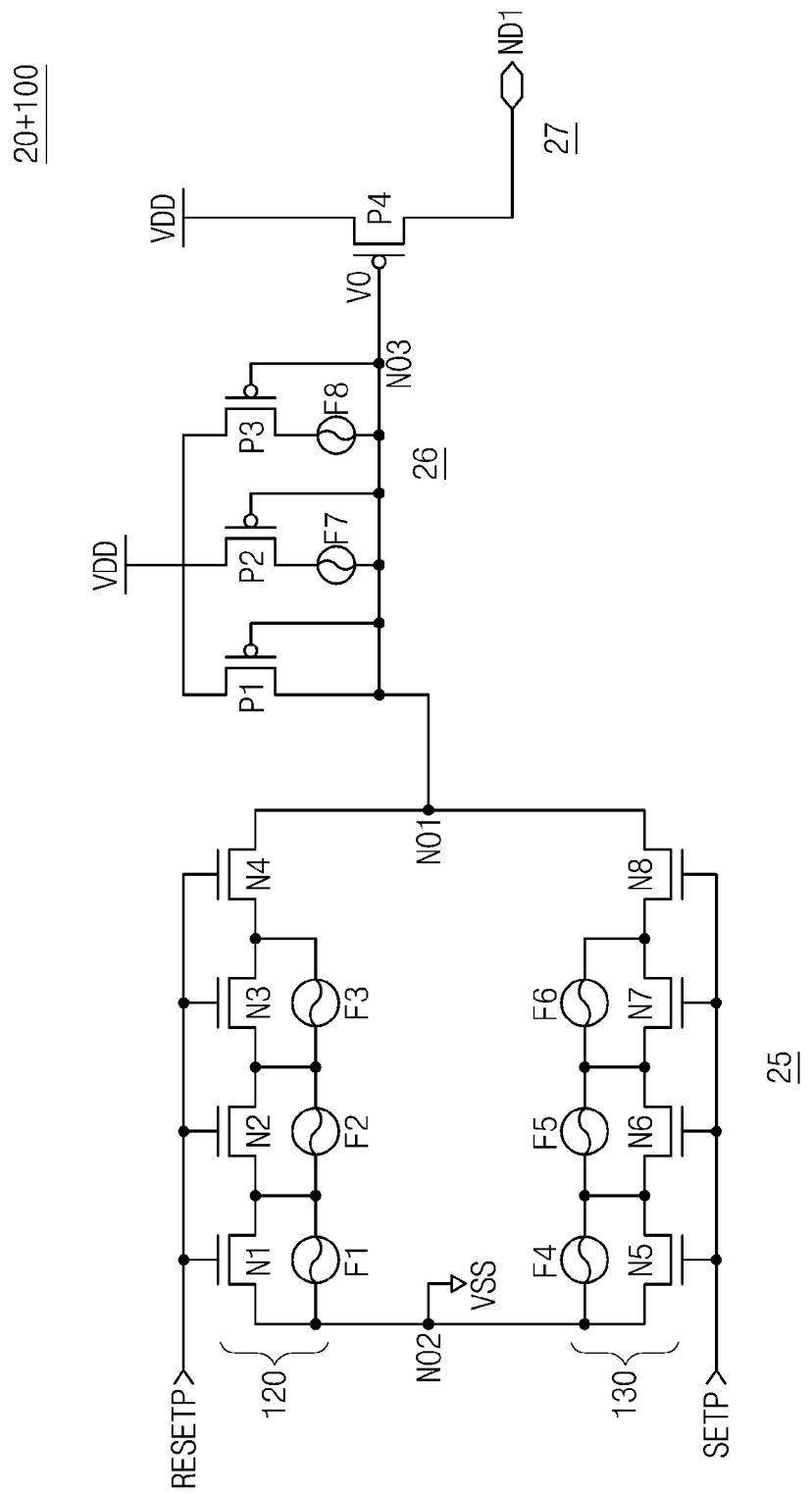
FIG. 14 is a circuit diagram illustrating a trimming circuit and a write circuit as illustrated in FIG. 13.

FIG. 14 is a circuit diagram illustrating a trimming circuit and a write circuit in. FIG. 13. In FIG. 14, a reference numeral 25 represents a current adjusting part, a reference numeral 26 represents an output voltage adjusting part, and a reference numeral 27 represents a current driving part.

A reset current adjusting part 120 in the current adjusting part 25 includes first to fourth NMOS transistors N1 to N4 and first to third fuses F1 to F3. Source-drain channels of the first to fourth NMOS transistors N1 to N4 are connected in series between nodes NO2 and NO1, and gates of the transistors N1 to N4 are connected in common with one another to receive the first selection pulse signal PRESET. The first to third fuses F1 to F3 are connected to the first to third NMOS transistors N1 to N3, respectively. For example, when the third fuse F3 is disconnected, a current from a source of the fourth NMOS transistor N4 flows through the third NMOS transistor N3. When the third fuse F3 remains connected, a current from the source of the fourth NMOS transistor N4 is applied to a source of the third NMOS transistor N3 via the third fuse F3 without passing through the third NMOS transistor N3.

A set current adjusting part 130 in the current adjusting part 25 includes first to fourth NMOS transistors N5 to N8 and first to third fuses F4 to F6. Source-drain channels of the first to fourth NMOS transistors N5 to N8 are connected in series between the nodes NO2 and NO1, and gates of the transistors N5 to N8 are connected in common with one another to receive the second selection pulse signal PSET. The first to third fuses F4 to F6 are connected to the first to third NMOS transistors N5 to N7, respectively. For example, when the third fuse F6 is disconnected, a current from a source of the fourth NMOS transistor N8 flows through the third NMOS transistor N7. When the third fuse F3 remains connected, a current from the source of the fourth NMOS transistor N8 is applied to a source of the third NMOS transistor N7 via the third fuse F6 without passing through the third NMOS transistor N7. The node NO1 corresponds to a current supply terminal.

The output voltage adjusting part 26 include first to third PMOS transistors P1 to P3 and first and second fuses F7 and F8. Sources of the first to third PMOS transistors P1 to P3 are connected with the power supply voltage VDD and gates of the transistors P1 to P3 are connected in common with a voltage output terminal VO.

Drains of the second and third PMOS transistors P2 and P3 are connected in common with the voltage output terminal VO via the first and second fuses F7 and F8, respectively. A drain of the first PMOS transistor P1 is connected with the voltage output terminal VO.

When the first fuse F7 is disconnected, the drain of the second PMOS transistor P2 is electrically separated from the voltage output terminal VO, and thus no driving current flows to the voltage output terminal VO. Since the second PMOS transistor P2 does not take part in current driving, a voltage level of the node NO1 decreases.

As illustrated in FIG. 14, the current driving part 27 includes a PMOS transistor P4. An output level of a write current of the PMOS transistor P4, for example, the magnitude of the write current, depends upon a voltage level of the node NO1.

As described above, the magnitude of a set or reset current pulse applied to a selected resistive memory cell is adjusted by generating a trimming signal according to a characteristic distribution shift value of resistive memory cells and by disconnecting the fuses based on the generated trimming signal. Thus, the fuses are selectively disconnected by the trimming signal, and thus a resistance value of a memory cell is trimmed appropriately, thus compensating for a write operation. Since a sensing margin is improved by compensating for the write operation, an erroneous read operation is minimized or reduced.

Figure 15:
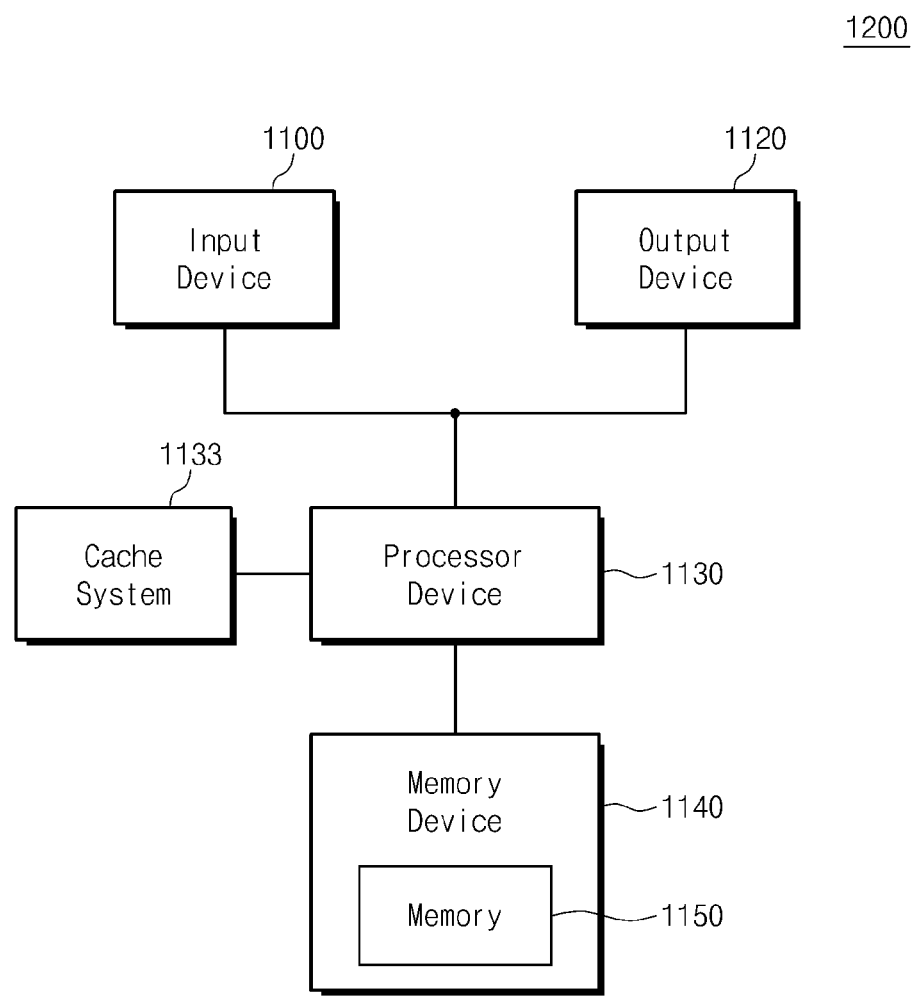
FIG. 15 is a block diagram illustrating an electronic system according to an exemplary embodiment of the inventive concept.

FIG. 15 is a block diagram illustrating an electronic system according to an exemplary embodiment of the inventive concept. Referring to FIG. 15, an electronic system 1200 includes an input device 1100, an output device 1120, a processor device 1130, a cache system 1133, and a memory device 1140.

As illustrated in FIG. 15, the memory device 1140 includes a resistive memory device 1150, such as PRAM according to an exemplary embodiment of the inventive concept. The processor device 1130 controls the elements 1100, 1120, and 1150 via corresponding interfaces. When the processor device 1130 uses the memory device 1140 including the resistive memory device 1150, a stable read operation is secured since a sensing margin of the resistive memory device 1150 can be determined optimally. Accordingly, it is possible to improve the performance of the electronic system 1200 including the resistive memory device 1150.

Figure 16:
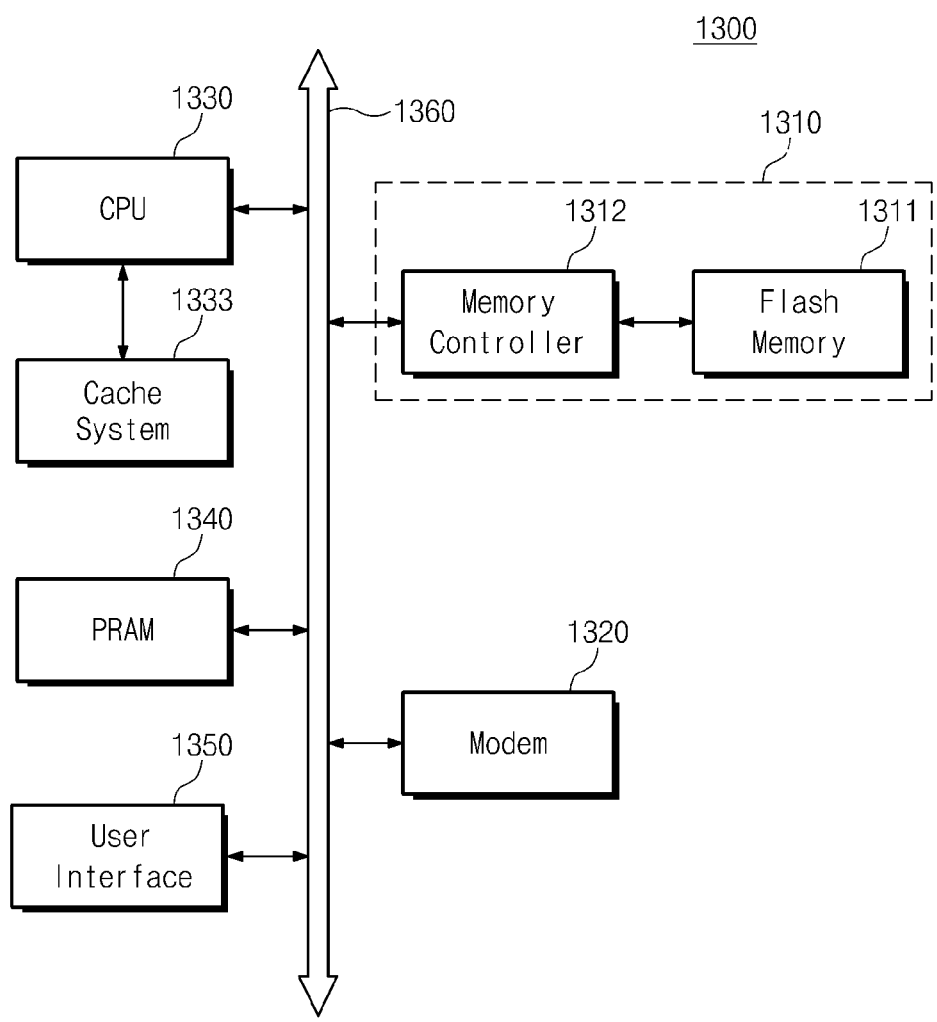
FIG. 16 is a block diagram illustrating a data processing device according to an exemplary embodiment of the inventive concept.

FIG. 16 is a block diagram illustrating a data processing device according to an exemplary embodiment of the inventive concept.

Referring to FIG. 16, a PRAM 1340 according to an exemplary embodiment of the inventive concept is mounted in a data processing device 1300, such as a mobile device or a desktop computer. When the data processing device 1300 uses the PRAM 1340 with an improved sensing margin, an erroneous read operation is minimized or reduced. Accordingly, it is possible to improve the performance of the data processing device 1300 including the PRAM 1340.

The data processing device 1300 further includes a flash memory system 1310, a modem 1320, a CPU 1330, a cache system 1333, and a user interface 1350. The elements 1310, 1320, 1330, 1340, and 1350 are connected with a bus 1360. According to an embodiment, the flash memory system 1310 is the same or substantially the same as a typical memory system, and includes a memory controller 1312 and a flash memory 1311. Data processed by the CPU 1330 or provided from an external device is stored in the flash memory system 1310. The flash memory system 1310 includes a solid state disk (SSD) device. According to an embodiment, the data processing device 1300 stably stores mass data in the flash memory system 1310. According to an embodiment, the data processing device 1300 further includes an application chipset, a camera image processor (CIS), an input/output device, etc.

The constituent elements of the data processing device 1300 are packed in one of various packages, such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

Figure 17:
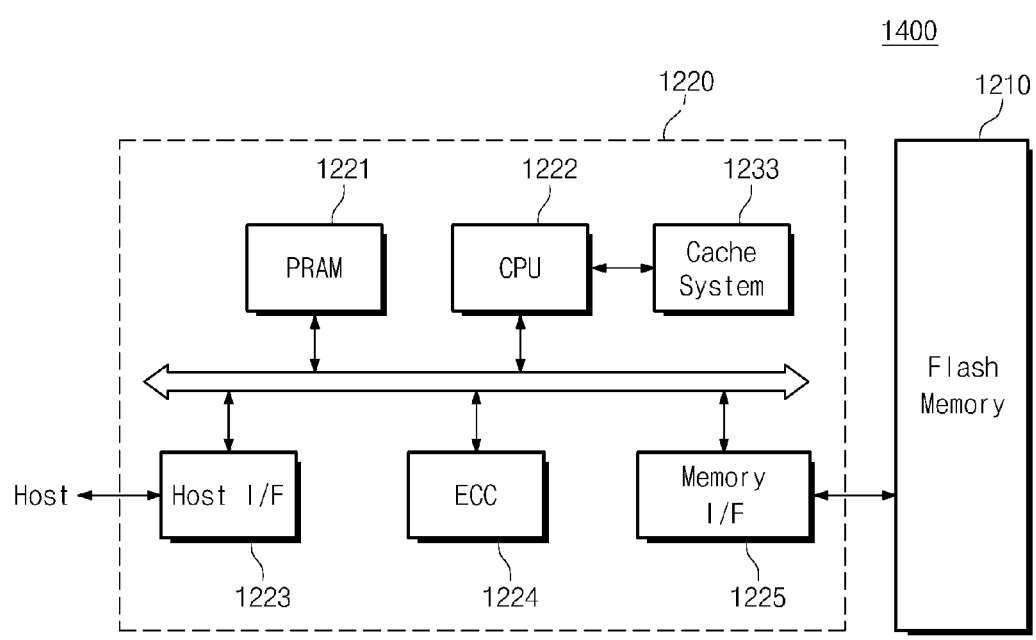
FIG. 17 is a block diagram illustrating a memory card according to an exemplary embodiment of the inventive concept.

FIG. 17 is a block diagram illustrating a memory card according to an exemplary embodiment of the inventive concept. Referring to FIG. 17, a memory card 1400 supports mass storage capacity. The memory card 1400 includes a memory controller 1220 having a PRAM 1221 according to an exemplary embodiment of the inventive concept. As illustrated in FIG. 17, when the memory card 1400 uses the PRAM 1221 as illustrated in FIG. 1, a data read operation of the PRAM 1221 is stabilized, and thus the performance of the memory card 1400 is improved.

The memory controller 1220 controls overall data exchange between a host and a flash memory 1210.

The PRAM 1221 in the memory controller 1220 is used as a working memory of a CPU 1222. A host interface 1223 provides an interface for data exchange between the memory card 1400 and the host. An ECC block 1224 detects and corrects an error of data read from the flash memory 1210. A memory interface 1225 provides an interface for data exchange between the CPU 1222 and the flash memory 1210. The CPU 1222 controls an overall operation associated with data exchange of the memory controller 1220. According to an embodiment, the memory card 1400 further includes a ROM which stores code data for interfacing with the host.

Figure 18:
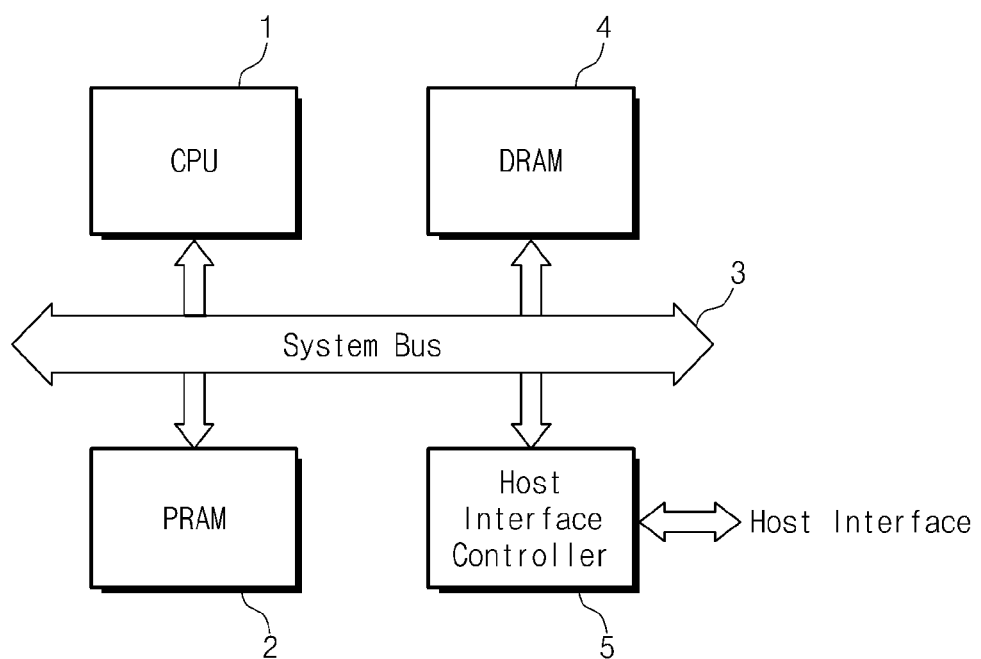
FIG. 18 is a block diagram illustrating a handheld device according to an exemplary embodiment of the inventive concept.

FIG. 18 is a block diagram illustrating a handheld device according to an exemplary embodiment of the inventive concept. Referring to FIG. 18, a handheld device, such as PMP, cellular phone, or smart phone, includes a CPU 1, a PRAM 2, a DRAM 4, and a host interface controller 5.

To increase competitiveness of the handheld device, an area occupied by the PRAM 2 and the DRAM 4 may decrease. According to an embodiment, when the handheld device includes dual processors, both the PRAM 2 and the DRAM 4 are not provided for each of the dual processors. According to an embodiment, a PRAM 2 or DRAM 4 has a dual-port structure and a shared memory area. As illustrated in FIG. 18, when the handheld device uses the PRAM 2 as shown in FIG. 1 as a resistive memory device, a data read error of the PRAM 2 is minimized or reduced, and thus a read operation is stably performed. Accordingly, the performance of the handheld device adopting the PRAM 2 is improved.

The embodiments are to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description. For example, according to an embodiment, an application of a characteristic distribution shift value used to generate a trimming signal and a method of generating and controlling the trimming signal may be changed or modified variously.

What is claimed is:

1. A resistive memory device comprising:
a memory cell array having a plurality of resistive memory cells; and
a trimming circuit configured to generate a trimming signal according to a characteristic distribution shift value of the resistive memory cells.

2. The resistive memory device of claim 1, wherein the characteristic distribution shift value is obtained based on a shift of a peak distribution value of a reset current for the resistive memory cells.

3. The resistive memory device of claim 1, further comprising a read circuit, wherein the trimming signal is applied to the read circuit.

4. The resistive memory device of claim 3, wherein the read circuit includes a sense amplifier, wherein the trimming signal is applied as a sensing reference value to the sense amplifier.

5. The resistive memory device of claim 3, wherein the read circuit includes a biasing part, wherein the trimming signal is applied as a bias value to the biasing part.

6. The resistive memory device of claim 1, further comprising a write circuit, wherein the trimming signal is applied to the write circuit.

7. The resistive memory device of claim 6, wherein at least one fuse connected with the write circuit is disconnected according to the trimming signal.

8. The resistive memory device of claim 1, wherein the resistive memory device includes a PRAM or an MRAM.

9. The resistive memory device of claim 1, wherein the characteristic distribution shift value is determined according to resistance values at set and reset tails of a resistance distribution of the resistive memory cells.

10. The resistive memory device of claim 9, wherein the trimming signal is determined to correspond to an intermediate value between the resistance values at the set and reset tails.

11. The resistive memory device of claim 1, wherein the characteristic distribution shift value is determined according to resistance values at set and reset peaks of a resistance distribution of the resistive memory cells.

12. The resistive memory device of claim 11, wherein the trimming signal is determined to correspond to an intermediate value between the resistance values of the set and reset peaks.

13. A read method of a resistive memory device which includes a plurality of resistive memory cells, the read method comprising:
generating a trimming signal corresponding to a characteristic distribution shift value of the resistive memory cells;
generating a read reference level according to the trimming signal; and
determining a data level of a sensing node according to the read reference level.

14. The read method of claim 13, wherein the characteristic distribution shift value is obtained based on a shift of a peak distribution value of a reset current for the resistive memory cells.

15. The read method of claim 13, wherein the characteristic distribution shift value is determined according to resistance values at a set tail of a resistance distribution of set memory cells of the resistive memory cells and resistance values at a reset tail of a resistance distribution of reset memory cells of the resistive memory cells.

16. A memory device comprising:
at least one memory cell;
a lead circuit configured to compare a cell voltage with a reference voltage and to output a result of the comparison; and
a trimming circuit configured to generate the reference signal, wherein a value of the reference signal shifts depending on a characteristic distribution shift value of the at least one memory cell.

17. The memory device of claim 16, wherein the characteristic distribution shift value is determined based on a shift of a peak distribution value of a reset current for the at least one memory cell.

18. The memory device of claim 16, wherein the characteristic distribution shift value is determined based on resistance values at set and reset tails or peaks of a resistance distribution for the at least one memory cell.

19. The memory device of claim 16, wherein trimming circuit includes a plurality of resistors, which are connected in series between a power supply voltage and a ground, and a plurality of switching elements that are respectively connected to the plurality of resistors.

20. The memory device of claim 16, wherein trimming circuit includes a plurality of resistors, which are connected in series between a power supply voltage and a ground, and a plurality of fuses that are respectively connected to the plurality of resistors.

* * * * *